(12) United States Patent
Park et al.

(10) Patent No.: US 11,410,879 B2
(45) Date of Patent: Aug. 9, 2022

(54) SUBTRACTIVE BACK-END-OF-LINE VIAS

(71) Applicant: INTERNATIONAL BUSINESS MACHINES CORPORATION, Armonk, NY (US)

(72) Inventors: Chanro Park, Clifton Park, NY (US); Koichi Motoyama, Clifton Park, NY (US); Kenneth Chun Kuen Cheng, Albany, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 186 days.

(21) Appl. No.: 16/841,994

(22) Filed: Apr. 7, 2020

(65) Prior Publication Data
US 2021/0313226 A1    Oct. 7, 2021

(51) Int. Cl.
*H01L 21/768* (2006.01)
*H01L 23/522* (2006.01)
*H01L 23/532* (2006.01)
*H01L 23/535* (2006.01)

(52) U.S. Cl.
CPC .. *H01L 21/76849* (2013.01); *H01L 21/76805* (2013.01); *H01L 21/76846* (2013.01); *H01L 21/76877* (2013.01); *H01L 21/76895* (2013.01); *H01L 23/5226* (2013.01); *H01L 23/535* (2013.01); *H01L 23/53209* (2013.01)

(58) Field of Classification Search
CPC .................. H01L 21/76849; H01L 23/5226
See application file for complete search history.

(56) References Cited

U.S. PATENT DOCUMENTS

| | | | |
|---|---|---|---|
| 7,602,063 B2 * | 10/2009 | Furusawa | H01L 21/02362 257/750 |
| 8,299,625 B2 | 10/2012 | Ponoth et al. | |
| 8,828,862 B2 | 9/2014 | Horak et al. | |
| 9,349,691 B2 | 5/2016 | Murray et al. | |
| 9,613,861 B2 | 4/2017 | Anderson et al. | |
| 9,793,163 B2 | 10/2017 | Bristol et al. | |
| 9,859,215 B1 | 1/2018 | Edelstein et al. | |
| 9,875,966 B1 | 1/2018 | Yang | |
| 2006/0113675 A1 | 6/2006 | Chang et al. | |
| 2012/0187566 A1 | 7/2012 | Horak et al. | |
| 2015/0056800 A1 | 2/2015 | Mebarki et al. | |
| 2019/0164781 A1 * | 5/2019 | Tien | H01L 21/76852 |
| 2020/0035605 A1 * | 1/2020 | Tsai | H01L 23/485 |

* cited by examiner

*Primary Examiner* — Farun Lu
(74) *Attorney, Agent, or Firm* — Tutunjian & Bitetto, P.C.; L. Jeffrey Kelly

(57) ABSTRACT

Integrated chips and methods of forming the same include forming a conductive layer over a lower conductive line. The conductive layer is etched to form a via on the lower conductive line. A first insulating layer is formed around the via. The first insulating layer is etched back to a height below a height of the via. An upper conductive line is formed on the via, making contact with at least a top surface and a side surface of the via.

19 Claims, 8 Drawing Sheets

SUBTRACTIVE BACK-END-OF-LINE VIAS

BACKGROUND

The present invention generally relates to integrated chip fabrication, and, more particularly, to the fabrication of vias between layers in an integrated chip.

Copper is commonly used to form vias and interconnects in integrated chips. However, as the physical dimensions of interconnects shrink, the use of copper becomes more challenging. For example, filling small vias with copper can be frustrated by a high structural aspect ratio, which can result in the formation of voids in the via. These voids decrease the amount of conductive, current-carrying material, and thus increase the resistance exhibited by the via. In some cases, a void may be large enough to effectively break the via, thereby destroying the finished device. Additionally, via resistance is increased by a smaller contact area, and this is compounded by misalignment between vias and the structures above and below them, resulting in a lower surface area at the interface between the structures. This decreased contact interface surface area can further increase the resistance.

SUMMARY

A method of forming an integrated chip includes forming a conductive layer over a lower conductive line. The conductive layer is etched to form a via on the lower conductive line. A first insulating layer is formed around the via. The first insulating layer is etched back to a height below a height of the via. An upper conductive line is formed on the via, making contact with at least a top surface and a side surface of the via.

A method of forming an integrated chip includes forming a low-resistance interface layer over a plurality of lower conductive lines. A conductive layer is formed over the low-resistance interface layer. The conductive layer and the low-resistance interface layer are etched to form a via on one of the lower conductive lines. A cap is selectively deposited on exposed top surfaces of the plurality of conductive lines after forming the via. A first insulating layer is formed around the via. The first insulating layer is etched back to a height below a height of the via. An upper conductive line is formed on the via, making contact with at least a top surface and a side surface of the via.

An integrated chip includes a lower conductive line. A via is formed on the lower conductive line. The via is laterally misaligned with respect to placement on the lower conductive line. An upper conductive line is formed on the via, in contact with a top surface and a side surface of the via.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present embodiments provide vias that are formed from alternative conductive materials by a subtractive process. A low-resistance liner is used at the bottom of the via, and a top contact area is enlarged by having the via's top surface extend beyond the bottom surface of the overlying interconnect. In the event of a misalignment error, the interconnect will make electrical contact with at least a portion of the sidewall of the via, thereby increasing the surface area of the connection and decreasing the resistance.

Figure 1:
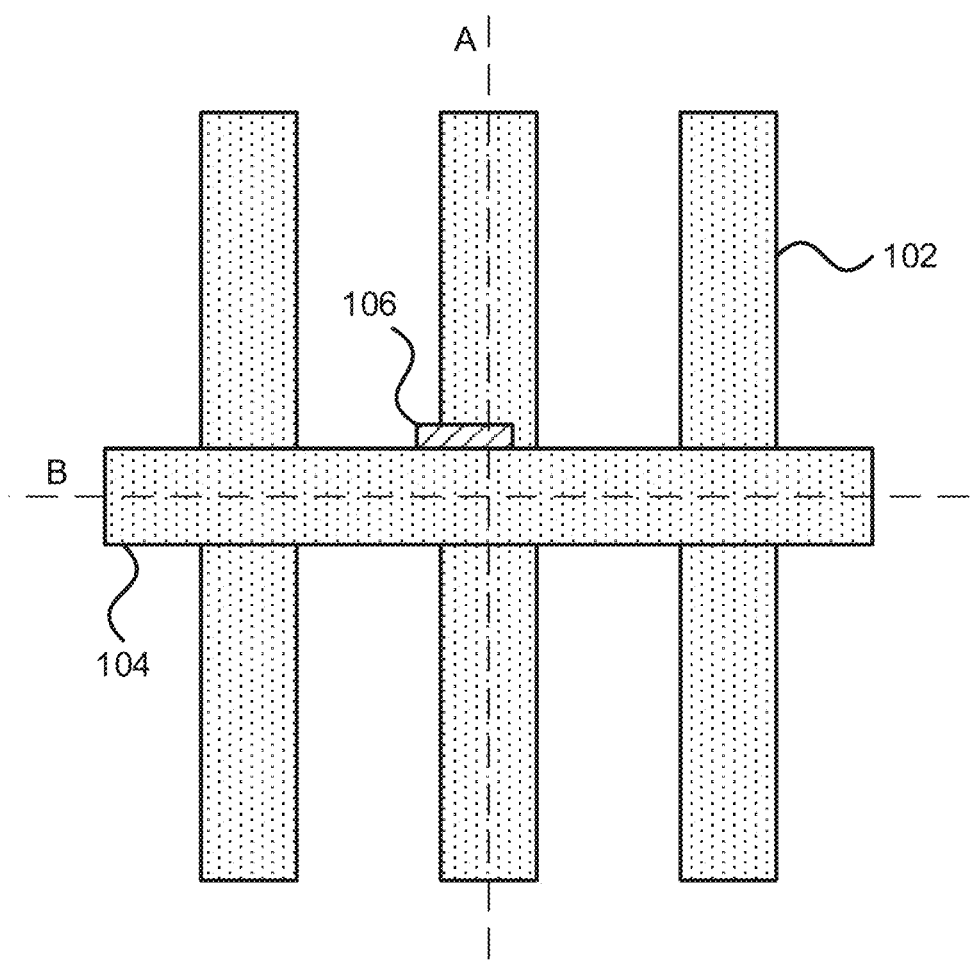
FIG. 1 is a top-down view of conductive lines in an integrated chip, which are connected by a via, but which are imperfectly aligned to one another, in accordance with an embodiment of the present invention.

Referring now to FIG. 1, a top-down view of an arrangement of conductive interconnects on multiple layers of an integrated chip is shown. A set of lower interconnects 102 is shown on a first level, with an upper interconnect 106 above them. A conductive via 106 connects interconnects between the two layers. The conductive via 106 is shown with a mispositioning error, such that the conductive via 106 does not perfectly align with either the lower interconnects 102 or the upper interconnect 106. Such alignment errors commonly arise when forming masks, during photolithographic patterning. Although the interconnects on the respective layers are specifically described herein as being oriented perpendicular with respect to one another, it should be understood that any appropriate arrangement is contemplated.

Two different cross-sections are indicated. A first cross-section A is shown as cutting on a plane parallel to the lower interconnects 102, while a second cross-section B is shown as cutting on a plane parallel to the upper interconnect 104. Both cross-sections cut through the conductive via 106, as well as at least one lower interconnect 102 and the upper interconnect 104. The present embodiments will be described with reference to figures that show both of these cross-sections. It should be understood that there may be some features which are not explicitly shown in the figures, but which would nonetheless be apparent to those having ordinary skill in the art.

Figure 2:
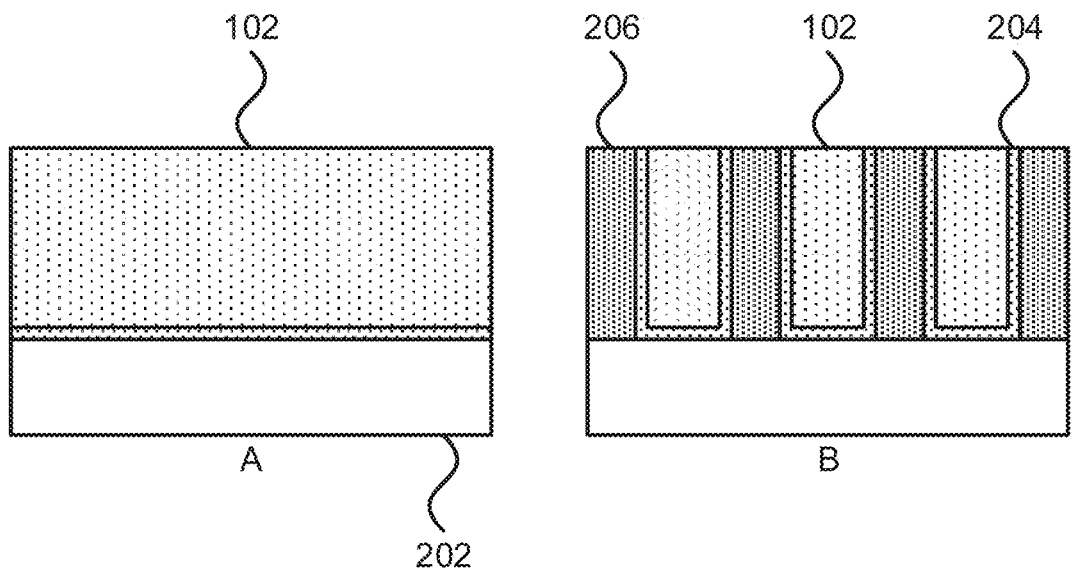
FIG. 2 is a set of cross-sectional views of a step in the fabrication of an integrated chip, where conductive lines and vias are misaligned, showing the formation of a set of lower conductive lines on a substrate, in accordance with an embodiment of the present invention.

Referring now to FIG. 2, cross-sectional views of a step in the fabrication of an integrated chip with low via resistance is shown. As noted above, cross-sections A and B are both shown. It should be understood that the figures may not be illustrated to scale, and that a consistent scale many not be maintained through the various depictions of the figures. The figures are intended to illustrate features of the present embodiments, and those having ordinary skill in the art will understand that the absolute and relative dimensions of the depicted structures can vary according to the needs of a particular application.

A substrate layer 202 is shown. In some embodiments, the substrate layer 202 can be formed from, e.g., a dielectric material such as silicon dioxide or a glass material. The substrate layer 202 can include active and/or passive electronic components, such as transistors, capacitors, transmission lines, vias, etc. There can additionally be one or more further layers underlying the substrate layer 202, with connectivity between the layers being provided by via structures. In embodiments where the layer shown is the front-end-of-line, the substrate layer 202 can be an oxide layer with active components and electrical interconnects. If the layer is not the front-end-of-line, then the substrate layer 102 can include one or more additional layers of conductive lines and vias, embedded in an interlayer dielectric.

A set of lower conductive lines 102 are formed on the substrate layer 202, with a liner 204. The lower conductive lines 102 can be formed from any appropriate conductive material, for example a metal, such as tungsten, nickel, titanium, molybdenum, tantalum, copper, platinum, silver, gold, ruthenium, iridium, rhenium, rhodium, cobalt, and alloys thereof. The lower conductive lines 102 can alternatively be formed from a doped semiconductor material such as, e.g., doped polysilicon.

The lower conductive lines 102 can be formed by any appropriate process. In some embodiments, a layer of conductive material can be deposited using an appropriate deposition process, masked, and then anisotropically etched. In other embodiments, a dielectric layer can be deposited, masked, and anisotropically etched to form trenches therewithin. Conductive material can then be deposited in the trenches. In either embodiment, a layer of liner material 204 can be formed on the bottom and side surfaces of the lower conductive lines 102, and an interlayer dielectric 206 can be formed around and between the lower conductive lines 102.

In some embodiments, the liner 204 can be formed from an exemplary diffusion barrier material, such as tantalum nitride, to prevent the conductive material from interacting with the interlayer dielectric material. In some embodiments, the interlayer dielectric 206 can be formed from an insulating material, such as silicon dioxide or a low-k dielectric material. The term "low-k," as used herein, refers to a material with a dielectric constant k that is lower than the dielectric constant of silicon dioxide. The interlayer dielectric 206 can be formed by, e.g., a flowable deposition process, followed by a chemical mechanical planarization (CMP) that stops on the top surface of the lower conductive lines 102.

It should be understood that the structures described herein can be formed using any appropriate deposition process, such as chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

It should be understood that the structures described herein can be formed using any appropriate isotropic etching process, such as a wet or dry chemical etch, or anisotropic etching process, such as a reactive ion etch (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. As used herein, the term "selective," in reference to a material removal process, denotes that the rate of material removal for a first material is greater than the rate of removal for at least another material of the structure to which the material removal process is being applied.

CMP is performed using, e.g., a chemical or granular slurry and mechanical force to gradually remove upper layers of the device. The slurry may be formulated to be unable to dissolve, for example, the via material, resulting in the CMP process's inability to proceed any farther than that layer.

Figure 3:
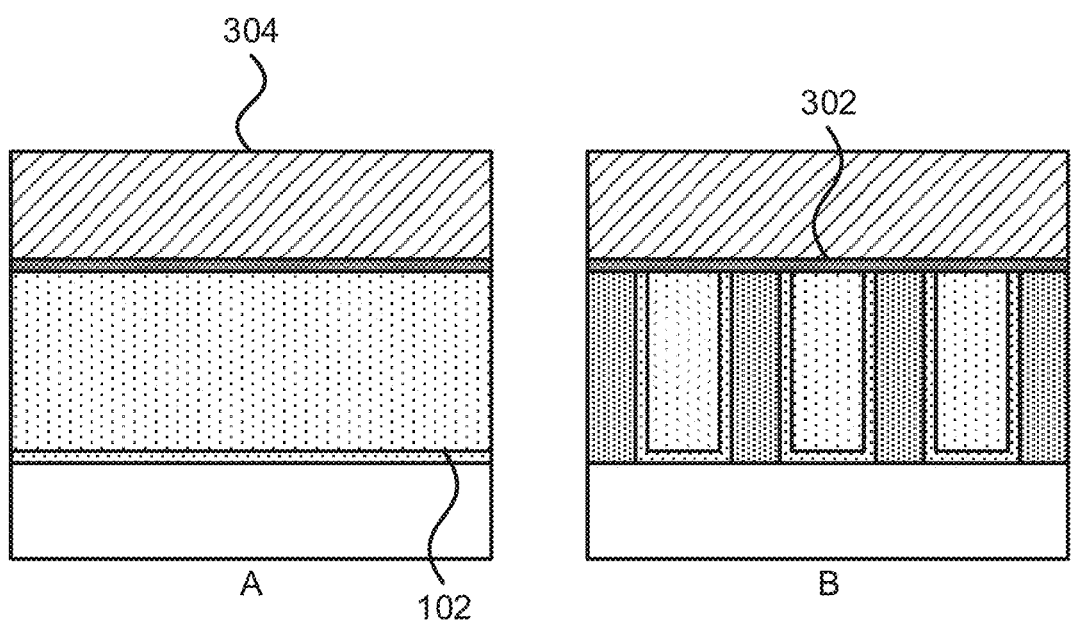
FIG. 3 is a set of cross-sectional views of a step in the fabrication of an integrated chip, where conductive lines and vias are misaligned, showing the formation of conductive layers over the set of lower conductive lines, in accordance with an embodiment of the present invention.

Referring now to FIG. 3, cross-sectional views of a step in the fabrication of an integrated chip with low via resistance is shown. A low-resistance interface layer 302 is deposited over the lower conductive lines 102. A conductive layer 304 is then deposited over the interface layer 302. Any appropriate deposition process can be used to form these layers. It is specifically contemplated that the interface layer 302 can be formed from cobalt, though it should be understood that other low-resistance materials can be used instead. The low-resistance interface liner 302 may be much thinner than the conductive layer 304. It is specifically contemplated that the conductive layer 304 can be formed from any appropriate conductive material. In some embodiments, the conductive layer 304 can be formed from a non-copper conductive material.

Figure 4:
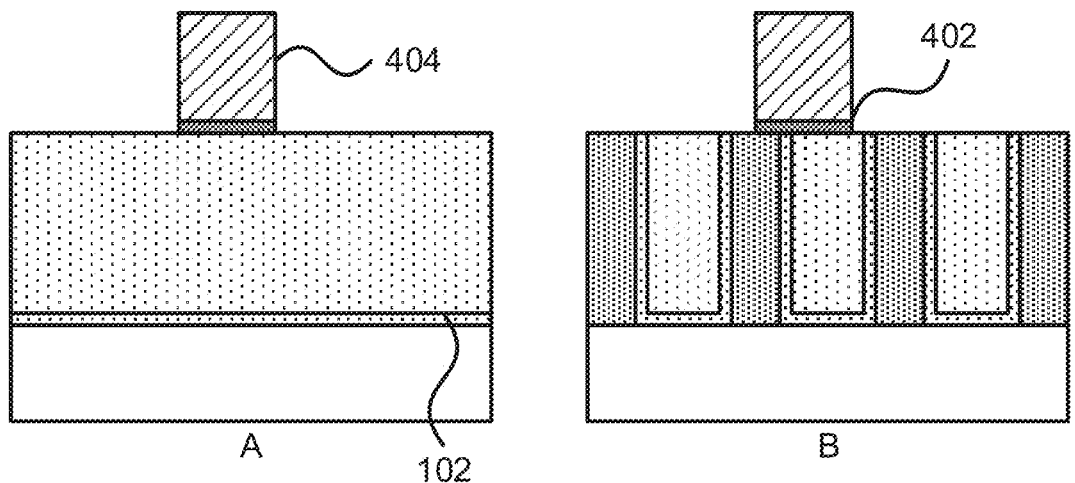
FIG. 4 is a set of cross-sectional views of a step in the fabrication of an integrated chip, where conductive lines and vias are misaligned, showing the patterning of the conductive layers to form a via over one of the lower conductive lines, in accordance with an embodiment of the present invention.

Referring now to FIG. 4, cross-sectional views of a step in the fabrication of an integrated chip with low via resistance is shown. The low-resistance interface layer 302 and the conductive layer 304 are both patterned to form liner 402 and via 404. This patterning can be performed using any appropriate process, for example including photolithographic etching after the formation of a mask.

As can be seen clearly in cross-section B, the via 404 is not perfectly aligned with the underlying lower conductive line 102. This mispositioning error can commonly arise during patterning, for example due to an improperly placed mask. In one specific example, where a patterning process is used with a 26 nm pitch, the mispositioning error can be on average about 3 nm. The mispositioning error causes an incomplete connection between the lower conductive line 102 and the via 404, where part of the bottom surface of the via hangs over the interlayer dielectric 206, rather than making contact with the lower conductive line 102, and the decreased contact area results in an increased resistance to electrical current through the connection.

Because a low-resistance liner material is used in the liner 402, the increase in the resistance due to mispositioning can be countered with a decrease in resistance, as compared to the relatively high-resistance materials that are commonly used in its place for copper diffusion barriers. Thus, because non-copper via materials make it possible to avoid the use of, e.g., tantalum nitride in the liner, the use of such materials in the via 404 make it possible to select a liner 402 with beneficial electrical properties.

Figure 5:
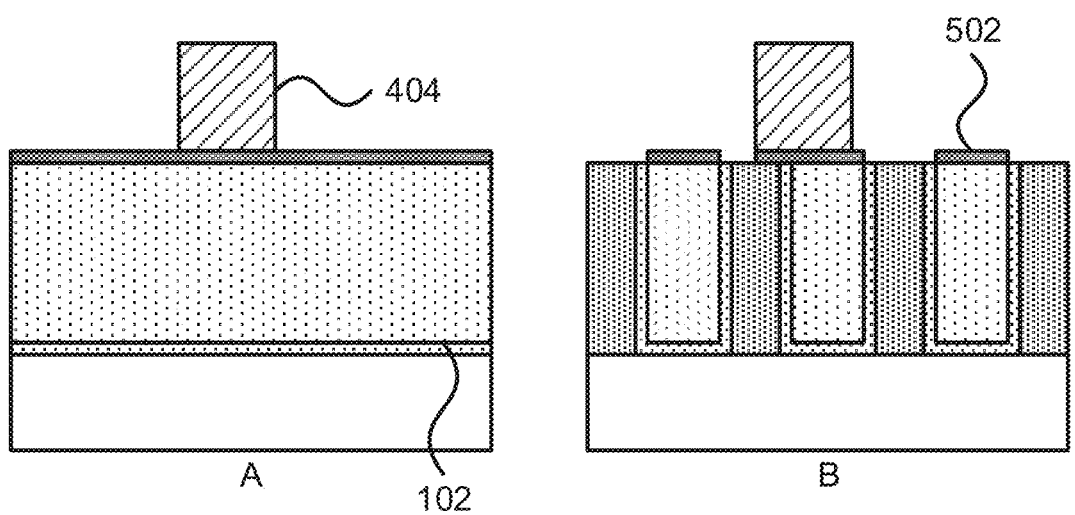
FIG. 5 is a set of cross-sectional views of a step in the fabrication of an integrated chip, where conductive lines and vias are misaligned, showing the selective deposition of a conductive cap layer over exposed lower conductive lines, in accordance with an embodiment of the present invention.

Referring now to FIG. 5, cross-sectional views of a step in the fabrication of an integrated chip with low via resistance is shown. A cobalt cap layer 502 is selectively deposited on the exposed top surfaces of the lower conductive lines 102, and may have an exemplary thickness between about 1 nm and about 5 nm. The selective deposition process does not leave any cap material on the top surfaces of the interlayer dielectric 206. The presence of the cobalt 502 cap mitigates reliability problems.

Figure 6:
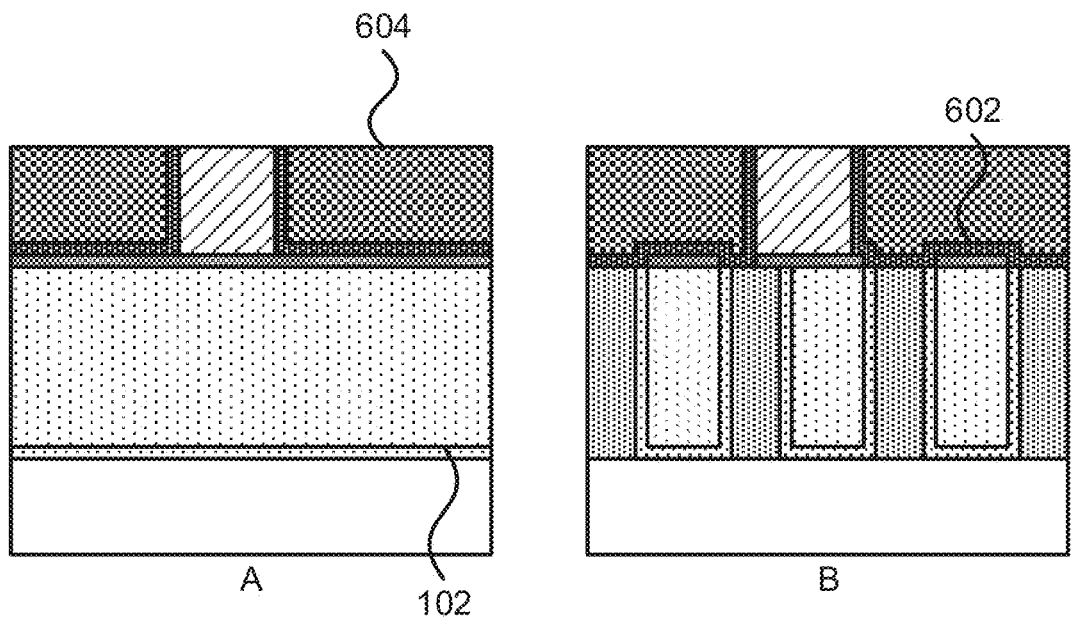
FIG. 6 is a set of cross-sectional views of a step in the fabrication of an integrated chip, where conductive lines and vias are misaligned, showing the deposition of dielectric layers around the via, in accordance with an embodiment of the present invention.

Referring now to FIG. 6, cross-sectional views of a step in the fabrication of an integrated chip with low via resistance is shown. A first dielectric layer 602 is conformally formed over the exposed surfaces of the interlayer dielectric 206, the cobalt cap 502, and the via 404, for example using a CVD or ALD process. In some embodiments, the first dielectric layer 602 can be formed from, e.g., silicon carbonitride, but it should be understood that any appropriate dielectric material can be used instead. A second dielectric layer 604 is then deposited over the first dielectric layer. It is specifically contemplated that the first dielectric layer 602 can be significantly thinner than the second dielectric layer 604.

The second dielectric layer 604 can be formed from, e.g., a low-k dielectric material or any other appropriate dielectric material, to reduce parasitic capacitances between the interconnects. The second dielectric layer 604 can be formed by, e.g., a flowable CVD process, and can be deposited to a height above the height of the via 404, before being polished down to the height of the via 404 using, e.g., CMP process. This CMP process also removes the portion of the first dielectric layer that is above the height of the via 404, thereby exposing the top surface of the via 404. The first dielectric layer 602 prevents diffusion of metals from the interconnects and vias into the second dielectric layer 602.

Figure 7:
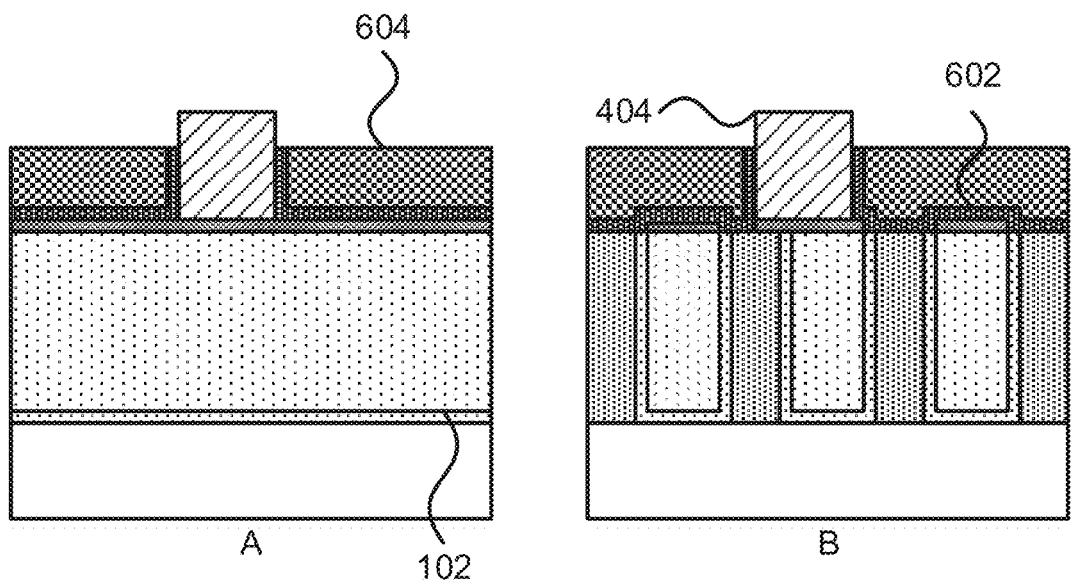
FIG. 7 is a set of cross-sectional views of a step in the fabrication of an integrated chip, where conductive lines and vias are misaligned, showing a partial etch-back of the deposited dielectric layers to expose sidewalls at the top of the via, in accordance with an embodiment of the present invention.

Referring now to FIG. 7, cross-sectional views of a step in the fabrication of an integrated chip with low via resistance is shown. The first dielectric layer 602 and the second dielectric layer 604 are etched back relative to the via 404 using, e.g., a timed isotropic or anisotropic etch. A portion of the sidewalls of the via 404 is exposed above the top level of the second dielectric layer 604. It is specifically contemplated that the second dielectric layer 604 may be recessed, relative to the top surface of the via 404, by about 7 nm to about 15 nm, though it should be understood that greater and lesser values for the recess depth are also contemplated.

Figure 8:
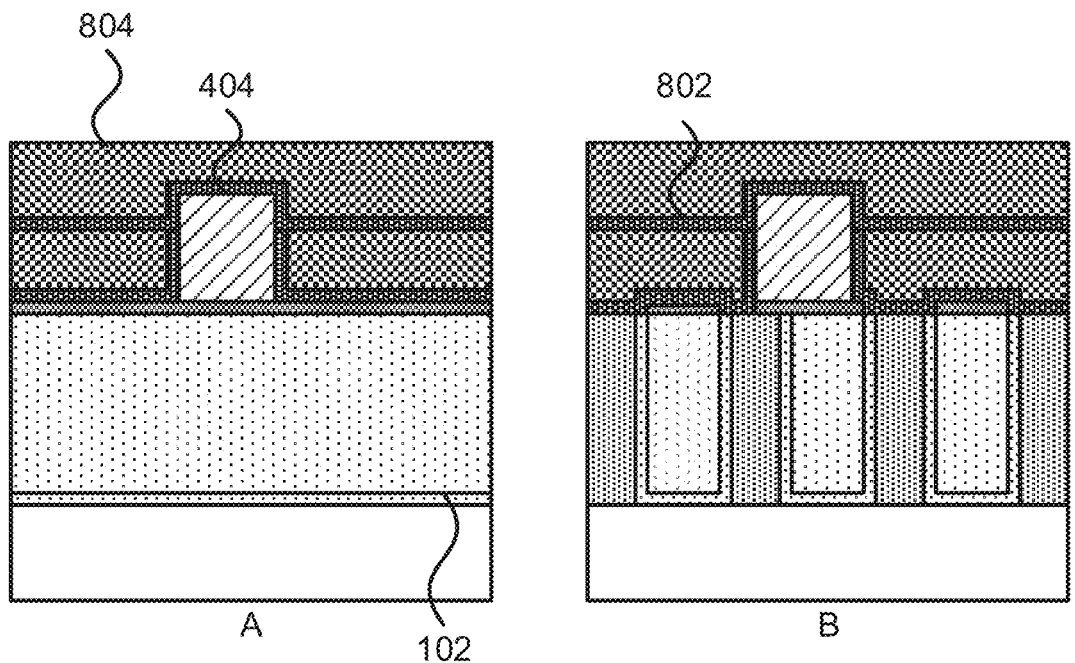
FIG. 8 is a set of cross-sectional views of a step in the fabrication of an integrated chip, where conductive lines and vias are misaligned, showing the formation of additional dielectric layers over the via and over the etched back dielectric layers, in accordance with an embodiment of the present invention.

Referring now to FIG. 8, cross-sectional views of a step in the fabrication of an integrated chip with low via resistance is shown. A third dielectric layer 802 is conformally deposited over the top surface of the second dielectric layer 604 and the top and side surfaces of the via 404, covering the via 404. A fourth dielectric layer 804 is then filled in over the third dielectric layer 802, to a height above the height of the via 404 and the third dielectric layer 802, using any appropriate deposition process, such as a flowable CVD. As above, the third dielectric layer 802 can be formed from the same material as the first dielectric layer 602, such as SiCN, or it can be formed from any other appropriate dielectric material. The fourth dielectric layer 804 can be formed from the same material as the second dielectric layer 604, such as a low-k dielectric material, or it can be formed from any other appropriate material.

Figure 9:
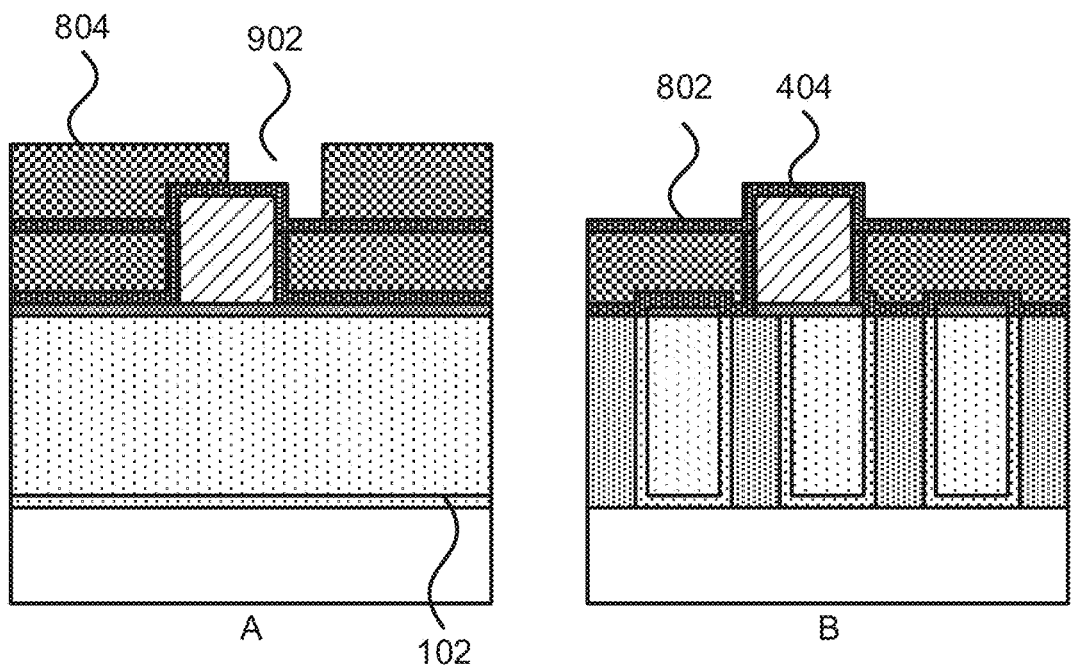
FIG. 9 is a set of cross-sectional views of a step in the fabrication of an integrated chip, where conductive lines and vias are misaligned, showing the formation of a trench in the additional dielectric layers, at least partially over the via, in accordance with an embodiment of the present invention.

Referring now to FIG. 9, cross-sectional views of a step in the fabrication of an integrated chip with low via resistance is shown. A trench 902 is formed in the fourth dielectric layer 804. The trench 902 can be formed by any appropriate process, for example including the formation of a photolithographic mask, followed by a selective anisotropic etch that stops on the third dielectric layer 802. The presence of the third dielectric layer 802 prevents this etch from going too deep and damaging the second dielectric layer 604. As shown, the positioning of the trench 902 during the patterning process can also reflect misalignment errors, with the trench 902 aligning imperfectly with the via 404.

Figure 10:
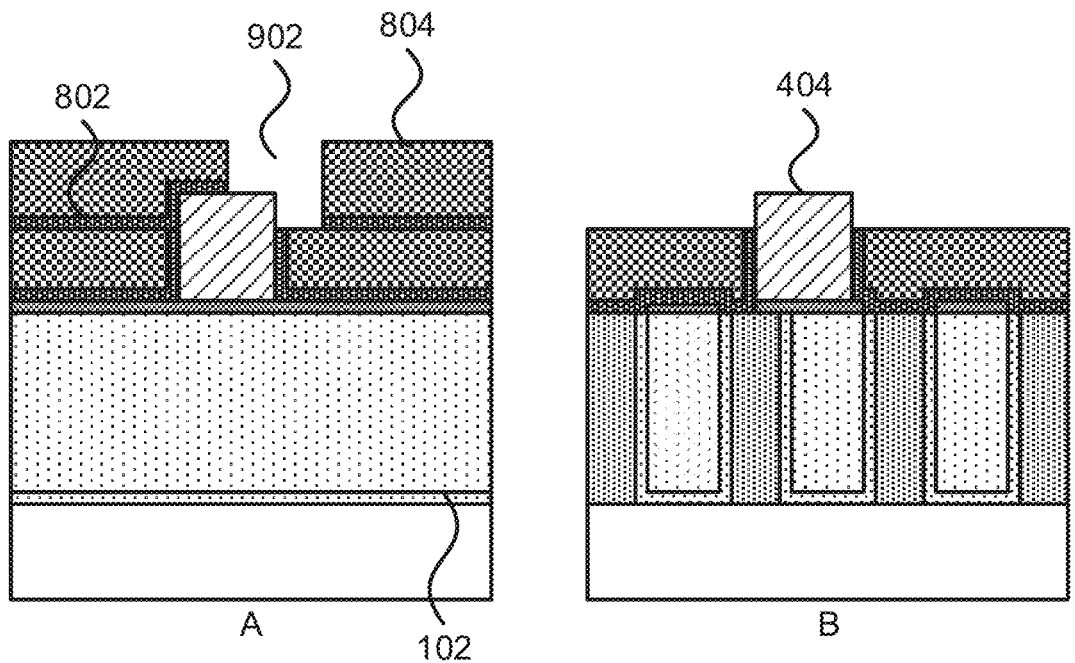
FIG. 10 is a set of cross-sectional views of a step in the fabrication of an integrated chip, where conductive lines and vias are misaligned, showing the exposure of the via in the trench, in accordance with an embodiment of the present invention.

Referring now to FIG. 10, cross-sectional views of a step in the fabrication of an integrated chip with low via resistance is shown. The exposed portion of the third dielectric layer 802 in the trench 902 is etched away, for example using a selective, timed isotropic etch or a selective anisotropic etch. This exposes the top surface of the via 404, as well as one or more side surfaces of the via 404, due to the mispositioning of the trench 902. Portions of the third dielectric layer 802 that are protected by the fourth dielectric layer 804 are unaffected. In the trench, the via 404 and the second dielectric layer 604 are exposed.

Figure 11:
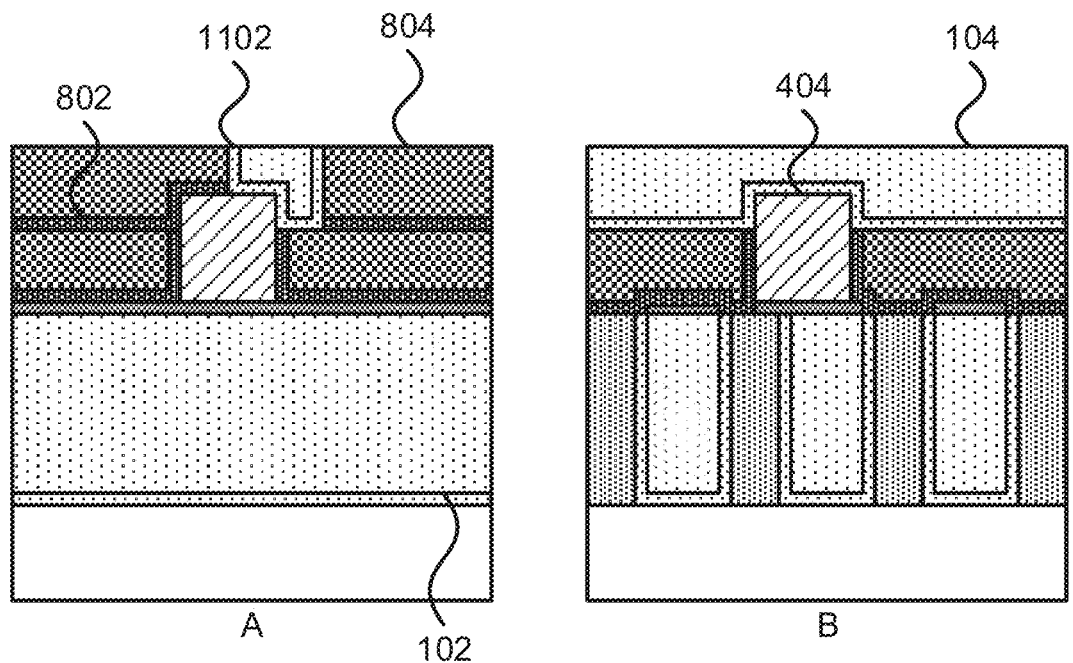
FIG. 11 is a set of cross-sectional views of a step in the fabrication of an integrated chip, where conductive lines and vias are misaligned, showing the formation of an upper conductive layer in the trench, and in electrical communication with the via, in accordance with an embodiment of the present invention.

Referring now to FIG. 11, cross-sectional views of a step in the fabrication of an integrated chip with low via resistance is shown. A barrier layer 1102 is conformally deposited in the trench 902, for example by a conformal deposition process like CVD or ALD. An upper conductive line 104 is then deposited to fill the trench. It is specifically contemplated that the upper conductive line 104 can be formed from, e.g., copper, but it should be understood that any appropriate conductive material can be used instead. The barrier layer 1102 can be formed from, e.g., tantalum nitride, in the event that copper is used for the upper conductive line 104, to prevent diffusion of the copper into the fourth dielectric layer 804. After deposition of these materials, a CMP process can be used to remove extraneous material from the top of the fourth dielectric layer 804, polishing the layer down to the height of the upper conductive line 104.

It should be noted that the upper conductive line 104 is formed over the via 404, with at least a portion of the upper conductive line 104 being in contact with sidewalls of the via 404, due to the misalignment errors. This contact on the sidewall of the via 404 increases the surface area of the connection and therefore reduces the contact resistance between the via 404 and the upper conductive line 104. Due to the etchback of the second dielectric layer 604, the via 404 protrudes upward into the body of the upper conductive line 104, even on surfaces that do not suffer from mispositioning errors, as shown in cross-section B.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease f description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 12:
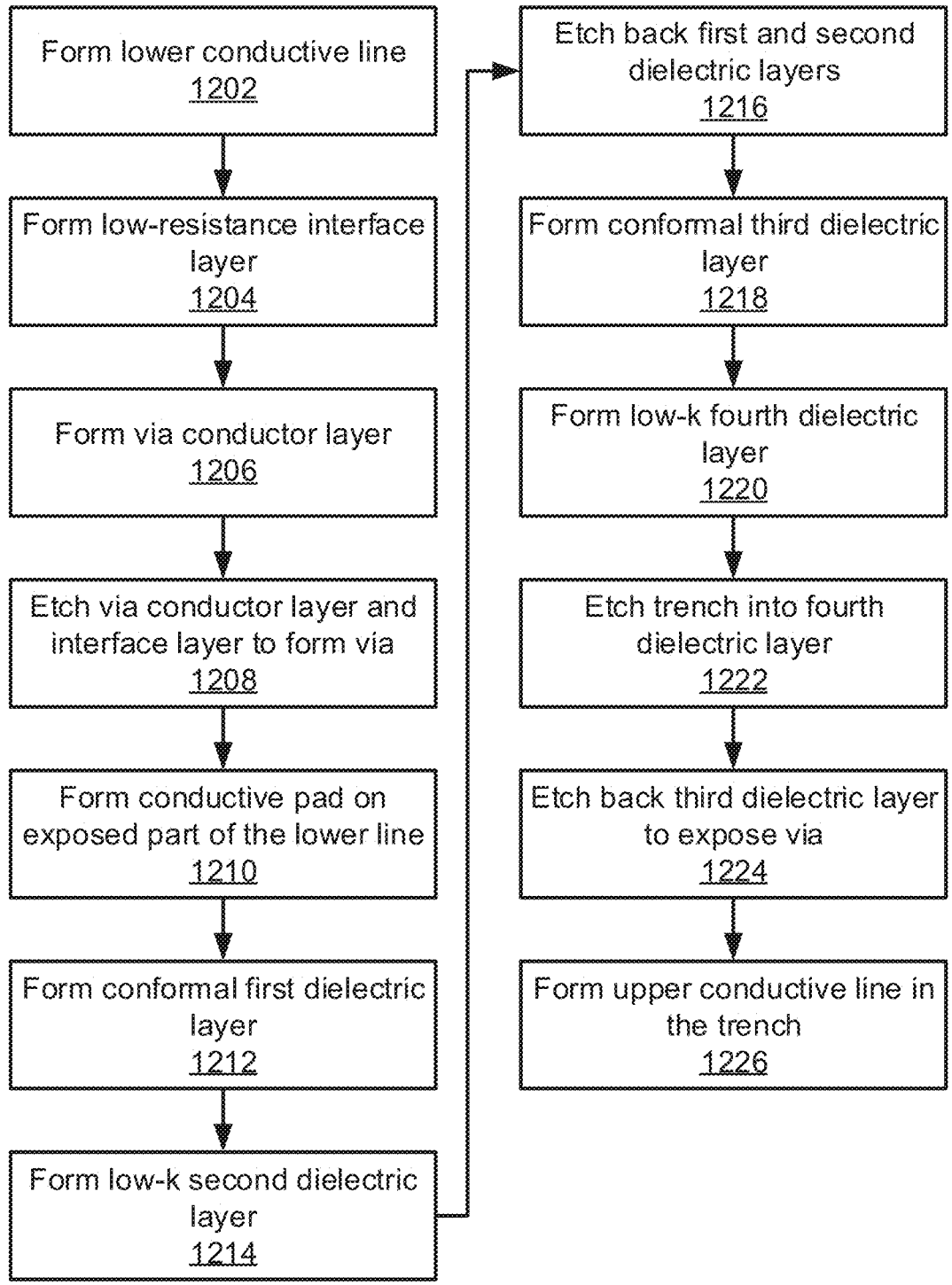
FIG. 12 is a block/flow-diagram of a process for fabricating an integrated chip with improved conductivity in via/line misalignments, in accordance with an embodiment of the present invention.

Referring now to FIG. 12, a method of forming an integrated chip with subtractive via formation is shown. It should be understood that some of the illustrated steps may be omitted, while still falling within the present principles. Block 1202 forms one or more lower conductive lines 104. This can be performed by any appropriate process patterning process. In some embodiments, the lower conductive lines 104 can be formed by forming trenches in a dielectric layer 206, followed by deposition of a conductive material to fill the trenches. In some embodiments, the lower conductive lines 104 can be patterned first, followed by deposition of insulating material around them. Photolithography and/or sidewall image transfer can be used to form these structures.

Block 1204 forms a low-resistance interface layer 302 over the top surfaces of the lower conductive lines 102 and the interlayer dielectric 206, by any appropriate deposition process. Block 1206 then forms a conductive layer 304 over the interface layer 302. As noted above, it is specifically contemplated that the conductive layer 304 may be formed by a non-copper conductor, though it should be understood that copper can also be used within the scope of the present embodiments. The interface layer 302 can similarly be formed by any appropriate conductive material, such as cobalt. Block 1208 then patterns and etches the conductive layer 304 and the interface layer 302 to form via 404, for example using a photolithographic patterning process. Block 1210 selectively deposits conductive pads 502 on the exposed surfaces of the conductive lines 102, including around the via 404 if any part of the underlying conductive line 102 is exposed due to a misalignment error.

Block 1212 forms a conformal first dielectric layer 602 over the via 404, and block 1214 fills in a second dielectric layer 604, including a CMP process that stops on the via 404 to expose the top surface of the via 404. Block 1216 then etches back the first dielectric layer 602 and the second dielectric layer 604 to expose sidewalls of the via 404. Block 1218 conformally forms a third dielectric layer 802 over the exposed portions of the via 404 and block 1220 fills in a fourth dielectric layer 804, to a height above the height of the via 404, using, for example, a flowable CVD deposition process. As noted above, it is specifically contemplated that the first and third dielectric layers can be formed from silicon carbonitride and that the second and fourth dielectric layers can be formed from a low-k dielectric material, but it should be understood that any suitable dielectric materials can be used instead.

Block 1222 selectively etches a trench 902 into the fourth dielectric layer 804, and block 1224 selectively etches away the exposed portions of the third dielectric layer 802 to expose top and side surfaces of the via 404. Block 1226 then forms upper conductive line 1104 in the trench 902. The upper conductive line 1104 contacts the upper surface of the via 404, as well as at least one side surface of the via 404, thereby reducing the contact resistance that could otherwise be elevated due to a misalignment error.

Figure 13:
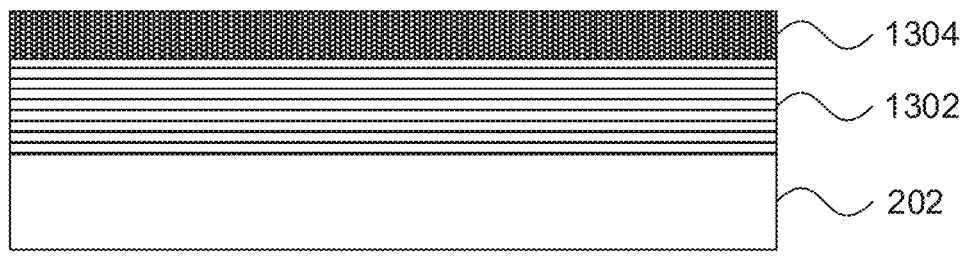
FIG. 13 is a cross-sectional view of an integrated chip package that includes one or more interconnect layers to for electrical power and/or signal communication, having low contact resistance in the event of via/line misalignment, in accordance with an embodiment of the present invention.

Referring now to FIG. 13, a cross-sectional view of an integrated chip package is shown. The package includes the substrate later 202, which in this embodiment includes one or more active or passive circuit components. These components may be connected to one another by interconnects within the substrate layer 202, but they can also be connected to one another by interconnects in a power/signal layer 1302. There may be multiple such power/signal layers 1302, and these layers can include conductive pathways that provide signal communication and power supply. As noted above, these power/signal layers 1302 can include structures that reflect mispositioning errors in the placement of vias. The present embodiments reduce the resistance of such contacts, thereby reducing power losses and increasing signal speeds.

A package layer 1304 is formed on the power/signal layers 1302. The package layer 1304 provides off-chip signal communications by interfacing with signal interconnects in the power/signal layers 1302. The package layer 1304 also provides for power connections to the package. Connections can be made to the package layer 1304 from off-chip devices by, e.g., solder connections. The embodiments described above can be used to form the power/signal layers 1302, for example by forming interconnects and vias that connect power and signal lines in the substrate layer 202 and the package layer 1304. The formation of the power/signal layers is known as back-end-of-line processing, as compared to the formation of the active and passive circuit components of the substrate layer 202, which is known as front-end-of-line processing.

Having described preferred embodiments of subtractive back-end-of-line vias (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an integrated chip, comprising:
   forming a conductive layer over a lower conductive line;
   etching the conductive layer to form a via on the lower conductive line;
   selectively depositing a cap over exposed top surfaces of the lower conductive line, after forming the via;
   forming a first insulating layer around the via;
   etching the first insulating layer back to a height below a height of the via; and
   forming an upper conductive line on the via, making contact with at least a top surface and a side surface of the via.

2. The method of claim 1, where a lowest surface of the upper conductive line has a height that is below a top surface of the via.

3. The method of claim 1, further comprising forming a low-resistance interface layer on the lower conductive lure, before forming the conductive layer.

4. The method of claim 3, wherein the conductive layer is formed from a non-copper conductive material and the low-resistance interface layer is formed from cobalt.

5. The method of claim 1, wherein forming the cap comprises a selective deposition process that deposits the conductive cap on only material that makes up the lower conductive line, and does not deposit cap material on other surfaces.

6. The method of claim 1, further comprising:
forming a second insulating layer over the first insulating layer and over the via by a conformal deposition process; and
forming a trench in the second insulating layer that exposes the top surface of the via and the side surface of the via, wherein the upper conductive line is formed in the trench.

7. The method of claim 6, further comprising forming a conformal insulating layer over the first insulating layer and the via before forming the second insulating layer.

8. The method of claim 7, further comprising etching away exposed portions of the conformal insulating layer in the trench before forming the upper conductive line.

9. A method of forming an integrated chip, comprising:
forming a low-resistance interface layer over a plurality of lower conductive lines;
forming a conductive layer over the low-resistance interface layer;
etching the conductive layer and the low-resistance interface layer to form a via on one of the lower conductive lines;
selectively depositing a cap on exposed top surfaces of the plurality of lower conductive lines after forming the via;
forming a first insulating layer around the via;
etching the first insulating layer back to a height below a height of the via; and
forming an upper conductive line on the via, making contact with at least a top surface and a side surface of the via.

10. The method of claim 9, wherein a lowest surface of the upper conductive line has a height that is below a top surface of the via.

11. The method of claim 9, wherein the conductive layer is formed from a non-copper conductive material and the low-resistance interface layer is formed from cobalt.

12. The method of claim 9, wherein the low-resistance interface layer and the cap are formed from the same material.

13. The method of claim 9, further comprising:
forming a second insulating layer over the first insulating layer and over the via by a conformal deposition process; and
forming a trench in the second insulating layer that exposes the top surface of the via and the side surface of the via, wherein the upper conductive line is formed in the trench.

14. The method of claim 13, further comprising forming a conformal insulating layer over the first insulating layer and the via before forming the second insulating layer.

15. The method of claim 14, further comprising etching away exposed portions of the conformal insulating layer in the trench before forming the upper conductive line.

16. An integrated chip, comprising:
a lower conductive line;
a via formed on the lower conductive line, wherein the via is laterally misaligned with respect to placement on the lower conductive line;
a conductive cap layer formed on the lower conductive line, extending past an edge of the lower conductive line underneath the via;
a dielectric layer directly on the conductive cap layer; and
an upper conductive line formed on the via, in contact with a top surface and a side surface of the via.

17. The integrated chip of claim 16, wherein a lowest surface of the upper conductive line has a height that is below a top surface of the via.

18. The integrated chip of claim 16, wherein the conductive cap layer comprises cobalt.

19. The integrated chip of claim 16, further comprising:
a first interlayer dielectric, formed around the lower conductive line, to a same height as the lower conductive line;
a first barrier layer, formed on the first interlayer dielectric and on sidewalls of the via;
a second interlayer dielectric, formed on the first barrier layer;
a second barrier layer, formed on the second interlayer dielectric and on sidewalls of the via, wherein the upper conductive line penetrates the second barrier layer to make contact with the via; and
a third interlayer dielectric, formed on the second harrier layer, to a same height as the upper conductive line.

* * * * *